(12) United States Patent
Sunaga et al.

(10) Patent No.: US 8,036,400 B2
(45) Date of Patent: Oct. 11, 2011

(54) VOLUME CONTROL APPARATUS AND VOLUME CONTROL PROGRAM

(75) Inventors: Tadaharu Sunaga, Neyagawa (JP); Masanori Shigematsu, Neyagawa (JP); Norio Etoh, Neyagawa (JP)

(73) Assignee: Onkyo Corporation, Neyagawa-shi (JP)

( * ) Notice: Subject to any disclaimer, the term of this patent is extended or adjusted under 35 U.S.C. 154(b) by 583 days.

(21) Appl. No.: 12/251,727

(22) Filed: Oct. 15, 2008

(65) Prior Publication Data

US 2009/0208035 A1   Aug. 20, 2009

(30) Foreign Application Priority Data

Feb. 18, 2008   (JP) .................................. 2008-35795

(51) Int. Cl.
*H03G 3/00* (2006.01)
(52) U.S. Cl. ......... 381/109; 381/102; 381/104; 381/107
(58) Field of Classification Search .................. 381/102, 381/104, 107, 109
See application file for complete search history.

(56) References Cited

U.S. PATENT DOCUMENTS

2002/0031236 A1   3/2002   Shimizu et al.

FOREIGN PATENT DOCUMENTS

| JP | 60-181914 | 12/1985 |
| JP | 63-192718 | 12/1988 |
| JP | 07-058561 | 3/1995 |
| JP | 07-254830 | 10/1995 |
| JP | 10-313224 | 11/1998 |
| JP | 11-068484 | 3/1999 |
| JP | 2001-28525 | 1/2001 |
| JP | 2002-043874 | 2/2002 |
| JP | 2002-101485 | 4/2002 |
| JP | 2002-271155 | 9/2002 |
| JP | 2004-023302 | 1/2004 |
| JP | 2004-056479 | 2/2004 |
| JP | 2004-222077 | 8/2004 |
| JP | 2008-193205 | 8/2008 |

*Primary Examiner* — Thanh V Pham
(74) *Attorney, Agent, or Firm* — Renner, Otto, Boisselle & Sklar, LLP

(57) ABSTRACT

A volume control apparatus comprises signal processing section for performing digital signal processing and a scaling process on an audio signal outputted from a sound source; level adjusting section for amplifying or attenuating a level of the audio signal outputted from the signal processing section, by an amount of adjustment determined based on an instructed amount of change, and outputting the amplified or attenuated audio signal to an outside; storage section for storing a level value of the audio signal outputted to the outside and the amount of adjustment for the audio signal adjusted by the level adjusting section; detecting section for detecting, when a volume controller is controlled by a user, time required for an amount of operation to reach a predetermined value; first setting section for setting an amount of operational change based on the level value stored in the storage section and the detected time; second setting section for setting an allowable amount of change by which the level adjusting section can make an adjustment by an attenuation process, based on the amount of adjustment stored in the storage section; determining section for determining one of the amount of operational change and the allowable amount of change that has a smaller value to be the instructed amount of change; and instructing section for instructing the level adjusting section to adjust the level of the audio signal based on the determined instructed amount of change.

10 Claims, 7 Drawing Sheets

FIG.2

| MASTER VOLUME LEVEL VALUE | 5dB |
|---|---|
| AMOUNT OF LEVEL ADJUSTMENT FOR ChL | −3dB |
| AMOUNT OF LEVEL ADJUSTMENT FOR ChC | −7dB |
| AMOUNT OF LEVEL ADJUSTMENT FOR ChR | −2dB |

VOLUME CONTROL APPARATUS AND VOLUME CONTROL PROGRAM

BACKGROUND OF THE INVENTION

1. Field of the Invention

The present invention relates to a volume control apparatus and a volume control program, and more particularly, to a volume control apparatus and a volume control program that control volume by adjusting the level of an audio signal.

2. Description of the Related Art

On audio apparatuses such as CD players, DVD players, HDD players, and AV amplifiers, a volume control apparatus that controls volume to be outputted to the outside is mounted. Recently, a number of volume control apparatuses using a rotary encoder have appeared. Such volume control apparatuses control an internal electronic volume based on a pulse train outputted from the rotary encoder. Conventional volume control apparatuses are set such that regardless of the volume level the volume level changes depending only on the rotation angle of the rotary encoder, and thus have a problem of poor operability.

A technique for solving such a problem is disclosed in Japanese Patent Application Laid Open No. 2001-28525. A volume control apparatus disclosed in this document determines an amount of change in volume level based on the operating speed of a rotary encoder and a current volume level. Specifically, in the case of increasing the volume level, the lower the current volume level the amount of change in volume level relative to the operating speed of the rotary encoder is made larger, and the higher the current volume level the amount of change in volume level relative to the operating speed is made smaller. Therefore, with respect to the same operating speed, when the volume level is low the amount of change can be made large, and when the volume level is high the amount of change can be made small. As a result, the operability improves.

Meanwhile, recently, a volume control apparatus in which a digital signal processor (hereinafter, referred to as the DSP) is provided at the previous stage of an electronic volume has appeared. The DSP can control the amplitude and frequency characteristic of an audio signal and thus can control sound quality to a desired one.

When the amplitude and the frequency characteristic are corrected by the DSP, if the level of a corrected audio signal exceeds 0 dB, then a so-called overflow may occur. To prevent occurrence of such an overflow, normally, the DSP performs a scaling process in which the level of a received audio signal is attenuated in advance by a predetermined amount.

In the case of adopting the technique described in Japanese Patent Application Laid Open No. 2001-28525 to a volume control apparatus in which a DSP that performs such a scaling process is provided at the previous stage of an electronic volume, noise or an unusual sound may be generated. Since an audio signal attenuated in advance by a scaling process by the DSP is inputted to the electronic volume, even when the level of an audio signal to be outputted to the outside is less than 0 dB, the electronic volume may perform an amplification process instead of an attenuation process. In this case, an amount of change determined based on a current volume level and an operating speed is too large and thus noise or an unusual sound may be generated.

SUMMARY OF THE INVENTION

An object of the present invention is therefore to provide a volume control apparatus having excellent operability and capable of suppressing occurrence of noise or an unusual sound upon volume control, even when an audio signal is corrected by a DSP.

A volume control apparatus as a preferred embodiment of the present invention comprises signal processing section for performing digital signal processing and a scaling process on an audio signal outputted from a sound source; level adjusting section for amplifying or attenuating a level of the audio signal outputted from the signal processing section, by an amount of adjustment determined based on an instructed amount of change, and outputting the amplified or attenuated audio signal to an outside; storage section for storing a level value of the audio signal outputted to the outside and the amount of adjustment for the audio signal adjusted by the level adjusting section; detecting section for detecting, when a volume controller is controlled by a user, time required for an amount of operation to reach a predetermined value; first setting section for setting an amount of operational change based on the level value stored in the storage section and the detected time; second setting section for setting an allowable amount of change by which the level adjusting section can make an adjustment by an attenuation process, based on the amount of adjustment stored in the storage section; determining section for determining one of the amount of operational change and the allowable amount of change that has a smaller value to be the instructed amount of change; and instructing section for instructing the level adjusting section to adjust the level of the audio signal based on the determined instructed amount of change.

The volume control apparatus according to the present invention compares an amount of operational change set based on the level of an audio signal outputted to the outside and the time required for an amount of operation to reach a predetermined value, with an allowable amount of change by which level adjusting section can make an adjustment by an attenuation process. For example, when the user instructs to amplify volume, if the amount of operational change is greater than the allowable amount of change, then the level adjusting section needs to perform an amplification process. In the case in which the level adjusting section performs an amplification process, when the amount of change is made large, noise is likely to be generated. Hence, in this case, the level is adjusted by the allowable amount of change. By this, the process performed by the level adjusting section can be prevented from being suddenly switched from an attenuation process to an amplification process and thus generation of noise can be suppressed. On the other hand, if the amount of operational change is smaller than the allowable amount of change, then the level adjusting section adjusts the level by the amount of operational change. In this case, the level adjusting section performs an attenuation process and does not perform an amplification process and thus noise is not generated. In a word, when the level adjusting section makes an adjustment based on the smaller one of the amount of operational change and the allowable amount of change, the level adjusting section does not perform an amplification process and thus generation of noise can be suppressed. Furthermore, if it is within a range in which the level adjusting section performs an attenuation process, the level is adjusted based on the amount of operational change and thus the operability improves.

In a further preferred embodiment, when the level adjusting section is amplifying the level of the audio signal, the determining section further determines a predetermined amount of change to be the instructed amount of change.

In this case, when the level adjusting section is performing an amplification process, the level adjusting section adjusts the level by a predetermined amount of change which is determined in advance (e.g., such an amount of change that does not cause noise even if the level adjusting section performs an amplification process). Therefore, even when the level adjusting section is performing an amplification process, generation of noise can be suppressed.

In a further preferred embodiment, the signal processing section further generates a plurality of channel audio signals based on the audio signal, the level adjusting section further amplifies or attenuates levels of the respective channel audio signals, the storage section further stores amounts of adjustment for the respective channel audio signals, the second setting section determines allowable amounts of change for the respective channel audio signals, and the determining section determines a smallest one of the amount of operational change and the allowable amounts of change for the respective channel audio signals, to be the instructed amount of change.

In this case, generation of noise can be suppressed in any of a plurality of channel audio signals.

In a further preferred embodiment, when the level adjusting section is amplifying at least one of the plurality of channel audio signals, the determining section further determines a predetermined amount of change to be the instructed amount of change.

In this case, even when the level adjusting section is performing an amplification process, it is possible to suppress noise from being generated in each of the channel audio signals.

In a further preferred embodiment, the detecting section further determines, based on control performed on the volume controller by the user, whether an instruction to increase volume or to reduce volume has been received, when the detecting section determines that the instruction to increase volume has been received, the second setting section sets the allowable amount of change, and when the detecting section determines that the instruction to reduce volume has been received, and the level adjusting section is attenuating the level of the audio signal, the determining section further determines the amount of operational change to be the instructed amount of change.

When an instruction to reduce volume is received, the process performed by the level adjusting section is not suddenly switched from an attenuation process to an amplification process. Hence, there is no need to consider an allowable amount of change.

BRIEF DESCRIPTION OF THE DRAWINGS

FIG. 2 is a diagram showing data stored in a memory shown in FIG. 1;

DETAILED DESCRIPTION OF THE PREFERRED EMBODIMENTS

Figure 1:
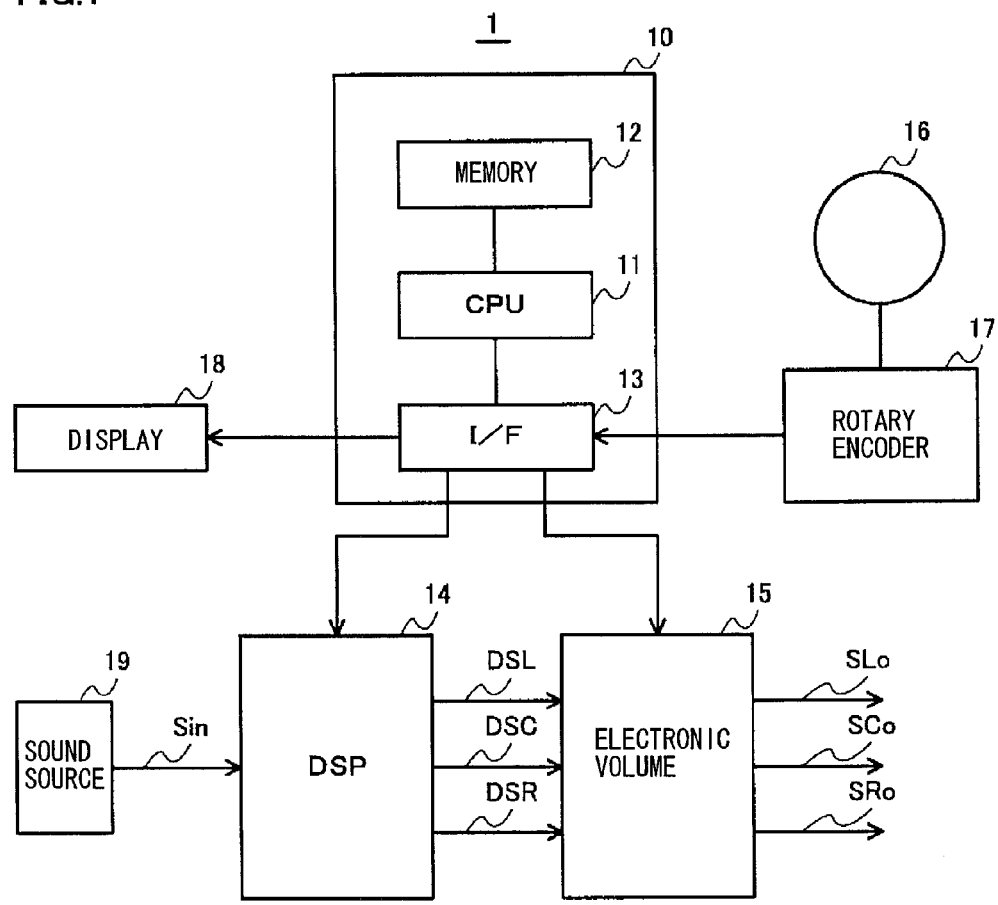
FIG. 1 is a functional block diagram showing a configuration of a volume control apparatus according to an embodiment of the present invention.

An embodiment of the present invention will be described in detail below with reference to the drawings. In the drawings, the same or corresponding parts are denoted by the same numerals and description thereof is not repeated.

(Overall Configuration)

Referring to FIG. 1, a volume control apparatus 1 includes a control unit 10, a digital signal processor (hereinafter, referred to as the DSP) 14, an electronic volume 15, a turn knob 16 and a rotary encoder 17 which serve as a volume controller, and a display 18.

The volume control apparatus 1 is connected to a sound source 19 and receives a digital audio signal Sin outputted from the sound source 19. The sound source 19 is, for example, an audio player such as a CD player or DVD player. Then, based on the received audio signal Sin, the volume control apparatus 1 outputs audio signals SLo, SCo, and SRo for three output channels. The audio signal SLo is supplied to a speaker (not shown) placed in front of the volume control apparatus 1 on the observer's left. Similarly, the audio signal SCo is supplied to a speaker (not shown) placed in front of the volume control apparatus 1 and the audio signal SRo is supplied to a speaker (not shown) placed in front of the volume control apparatus 1 on the observer's right.

Note that although in FIG. 1 the volume control apparatus 1 has three output channels, the number of output channels may be two or may be greater than three (e.g., six channels).

The DSP 14 performs digital signal processing on a digital audio signal Sin and outputs digital audio signals for a plurality of output channels. Specifically, the DSP 14 corrects the amplitude and frequency characteristic of the audio signal Sin by digital signal processing and outputs an audio signal DSL for the front left speaker, an audio signal DSC for the front speaker, and an audio signal DSR for the front right speaker.

The DSP 14 further performs a scaling process. When the audio signals DSL, DSC, and DSR (which are collectively and simply referred to as the audio signals DS) having been corrected by the digital signal processing have a frequency component exceeding 0 dB, an overflow occurs, going into a so-called digital clip state. Such a digital clip state causes noise or an unusual sound. To prevent occurrence of such an overflow, the DSP 14 performs a scaling process. Specifically, the DSP 14 attenuates the volume level (hereinafter, simply referred to as the level) of the digital audio signal Sin by a predetermined amount of attenuation and thereafter performs digital signal processing on the attenuated digital audio signal Sin. By this operation, the DSP 14 makes the maximum level of the audio signals DS to be outputted less than 0 dB.

Note that the DSP 14 can perform different digital signal processings for different output channels. The audio signals DS (DSL, DSC, and DSR) outputted from the DSP 14 are converted into analog signals by a D/A converter (not shown).

The electronic volume 15 adjusts the levels of the analog-converted audio signals DS, according to an instruction from the control unit 10. The electronic volume 15 includes an attenuating unit (not shown) that attenuates an audio signal; and a boost unit (not shown) that amplifies an audio signal. Then, the levels of the analog-converted audio signals DS are attenuated or amplified and the attenuated or amplified audio signals DS are outputted as audio signals SLo, SCo, and SRo (hereinafter, these signals are also collectively referred to as So). The audio signal SLo is inputted to the front left speaker (not shown). Similarly, the audio signal SCo is inputted to the front speaker and the audio signal SRo is inputted to the front right speaker.

The turn knob 16 turns in a forward or reverse direction by a user operation. The rotary encoder 17 outputs pulse trains according to the turning direction and turning angle of the turn knob 16 to the control unit 10. The rotary encoder 17 outputs two types of pulse trains having different phases each time the turn knob 16 turns at a predetermined turning angle. The control unit 10 compares the two types of pulse trains outputted from the rotary encoder 17, to determine the turning direction of the turn knob 16.

The control unit 10 controls the entire volume control apparatus 1. The control unit 10 first sets a digital signal processing condition in the DSP 14 according to a user operation and instructs the DSP 14 to perform digital signal processing using the set condition. Also, the control unit 10 instructs the DSP 14 to attenuate the level of an audio signal Sin by a predetermined amount (e.g., −10 dB) by a scaling process.

Also, the control unit 10 detects pulse trains outputted from the rotary encoder 17 to determine a turning direction (forward or reverse direction) of the turn knob 16. Then, based on the turning direction, the control unit 10 determines whether the user has instructed to increase volume (volume up) or to reduce volume (volume down). In the present embodiment, when the turn knob 16 turns in the forward direction the control unit 10 determines that a volume-up instruction has been received, and when the turn knob 16 turns in the reverse direction the control unit 10 determines that a volume-down instruction has been received. The control unit 10 further detects a turning speed of the turn knob 16. Specifically, the control unit 10 detects a cycle of a pulse train transmitted from the rotary encoder 17.

When the control unit 10 detects an operation performed on the turn knob 16 by the user, the control unit 10 further instructs the electronic volume 15 to attenuate or amplify received audio signals DS by an amount of change (hereinafter, referred to as the instructed amount of change) determined by a predetermined process and output the attenuated or amplified audio signals DS as audio signals So. The electronic volume 15 attenuates or amplifies the received audio signals DS by an amount of level adjustment obtained by changing a current amount of level adjustment by the instructed amount of change. The control unit 10 determines the instructed amount of change by a method which will be described later, such that noise or an unusual sound is not generated in the electronic volume 15.

The control unit 10 is, for example, a microcomputer and includes a central processing unit (hereinafter, referred to as the CPU) 11, a memory 12, and an interface unit 13 that controls passing of data with the components 14 to 18. As shown in FIG. 2, the memory 12 stores the level value of audio signals So outputted from the volume control apparatus 1, as a master volume level value. The master volume level value is displayed on the display 18. The user can control volume using the turn knob 16 while watching the master volume level value displayed on the display 18. Note that the master volume level value is determined based on audio signals for a plurality of output channels and a determination method thereof is known.

As shown in FIG. 2, the memory 12 further stores amounts (amounts of level adjustment) by which the electronic volume 15 adjusts the levels of audio signals DS. As shown in FIG. 2, the memory 12 stores amounts of level adjustment for the respective output channels.

The memory 12 further stores a volume control program. By the CPU 11 executing the volume control program stored in the memory 12, the operation of the control unit 10, which will be described in detail later, is implemented. Note that the volume control program may be stored in a hard disk drive (not shown) instead of in the memory 12.

(Summary of the Operation)

A summary of the operation of the volume control apparatus 1 will be described below.

The electronic volume 15 in the volume control apparatus 1 generates noise or an unusual sound when greatly amplifying audio signals DS. Hence, the control unit 10 sets the instructed amount of change to a small value while the electronic volume 15 performs an amplification process (hereinafter, this state is referred to as the amplification mode). While the electronic volume 15 performs an attenuation process, the control unit 10 sets the instructed amount of change according to an operation performed on the turn knob 16 and controls volume (hereinafter, this state is referred to as the attenuation mode).

On the other hand, even when the electronic volume 15 is performing an attenuation process, depending on the operation performed on the turn knob 16, the process performed by the electronic volume 15 may be suddenly switched from the attenuation process to an amplification process (hereinafter, this state is referred to as the transition mode). In this case, if the instructed amount of change is set according to the operation performed on the turn knob 16, the process by the electronic volume 15 is switched from attenuation to amplification, which may cause noise or an unusual sound. Therefore, in the case of the transition mode, the control unit 10 sets the instructed amount of change such that the process by the electronic volume 15 is not switched from attenuation to amplification.

The operation of the control unit 10 in each mode (the amplification mode, the attenuation mode, and the transition mode) will be described using specific examples. Note that although, as shown in FIGS. 1 and 2, the electronic volume 15 adjusts the levels of audio signals for three output channels, here, for simplification of description, it is assumed that the electronic volume 15 adjusts the level of one audio signal.

(When the Volume Control Apparatus is in the Attenuation Mode)

Figure 3:
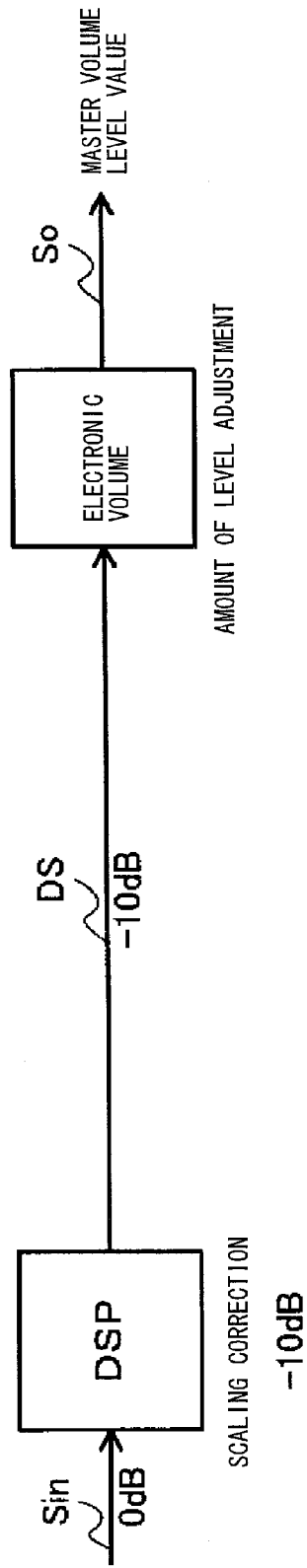
FIG. 3 is a diagram for describing a summary of the operation of the volume control apparatus shown in FIG. 1.

Referring to FIG. 3, for example, it is assumed that the DSP 14 always attenuates the level of an audio signal Sin from the sound source 19 by −10 dB by a scaling process. Here, when the master volume level value is −30 dB, the electronic volume 15 attenuates an audio signal DS outputted from the DSP 14 by −20 dB and outputs an audio signal So. That is, the amount of level adjustment of the electronic volume 15 for this case is −20 dB. This state is considered as an initial state.

It is assumed that in the initial state the user turns the turn knob 16 in a direction (forward direction) of increasing volume (case 1 in FIG. 3). At this time, the control unit 10 determines an amount of change instructed by the user operation (hereinafter, referred to as the amount of operational change) based on a pulse train cycle detected based on a pulse train transmitted from the rotary encoder 17, and a current master volume level value (i.e., the master volume level value in the initial state=−30 dB) stored in the memory 12. The amount of operational change determined at this time is assumed to be 15 dB.

Subsequently, the control unit 10 determines an amount of level change by which the electronic volume 15 can make an adjustment by an attenuation process (hereinafter, referred to as the allowable amount of change), based on the following equation (1):

$$\text{Allowable amount of change} = 0 \text{ (dB)} - \text{amount of level adjustment (dB)} \quad (1).$$

That is, the allowable amount of change is the difference between the current amount of level adjustment (here, −20 dB) and 0 dB. Thus, the allowable amount of change for case 1 is 20 dB.

Then, the control unit 10 compares the amount of operational change with the allowable amount of change and determines the one with a smaller value to be the instructed amount of change. Here, the amount of operational change (15 dB) is smaller than the allowable amount of change (20 dB) and thus the control unit 10 determines the instructed amount of change to be 15 dB.

In a word, in case 1, the amount of operational change is the amount by which the electronic volume 15 can make an adjustment only by an attenuation process. That is, in this case, the volume control apparatus 1 is in the attenuation mode. Therefore, using the amount of operational change as the instructed amount of change, the control unit 10 instructs the electronic volume 15 to increase the audio signal level by 15 dB. In response to the instruction, the electronic volume 15 sets the amount of level adjustment to −5 dB (=−20 dB+15 dB). Then, the electronic volume 15 attenuates the level of the inputted audio signal DS by −5 dB. By the above-described process, the level of an audio signal So to be outputted from the electronic volume 15 is increased from −30 dB in the initial state to −15 dB. The control unit 10 stores the updated master volume level value (−15 dB) and amount of level adjustment (−5 dB) in the memory 12.

(When the Volume Control Apparatus is in the Transition Mode)

Next, it is assumed that the user further turns the turn knob 16 in the direction of increasing volume, from the state of case 1 (case 2). At this time, the control unit 10 determines an amount of operational change based on a pulse train cycle detected based on a pulse train, and the master volume level value (−15 dB) obtained in case 1. The amount of operational change determined at this time is assumed to be 10 dB.

The control unit 10 determines an allowable amount of change by equation (1). At this time, the amount of level adjustment (−5 dB) in case 1 which is stored in the memory 12 is assigned to the amount of level adjustment in equation (1). Hence, the allowable amount of change is 5 dB.

The control unit 10 compares the amount of operational change (10 dB) with the allowable amount of change (5 dB) and determines the allowable amount of change having a smaller value to be the instructed amount of change. If the control unit 10 determines the amount of operational change to be the instructed amount of change, then the amount of level adjustment of the electronic volume 15 increases from −5 dB to +5 dB. That is, the process by the electronic volume 15 is suddenly switched from an attenuation process to an amplification process. Such a sudden change in process becomes a cause of noise or an unusual sound. Therefore, the control unit 10 uses the allowable amount of change as the instructed amount of change and thereby prevents the process by the electronic volume 15 from being suddenly switched from an attenuation process to an amplification process. By this, the amount of level adjustment of the electronic volume 15 is 0 dB and the master volume level value is −10 dB.

(When the Volume Control Apparatus is in the Amplification Mode)

It is assumed that the user further turns the turn knob 16 in the direction of increasing volume, from the state of case 2 (case 3). At this time, the control unit 10 determines that the allowable amount of change is 0 dB. When the allowable amount of change is 0 dB or greater, in order to increase volume, the electronic volume 15 needs to perform an amplification process. If the level of an audio signal DS is significantly amplified by an amplification process, noise or an unusual sound is generated. Hence, the control unit 10 determines the instructed amount of change to be such a predetermined amount of change (here, 1 dB) that does not cause noise. Specifically, when the electronic volume 15 performs an amplification process, the control unit 10 amplifies the audio signal DS in 1 dB increments, regardless of the operating speed of the rotary encoder 17.

As described above, the control unit 10 determines an instructed amount of change based on each mode (the attenuation mode, the transition mode, or the amplification mode) such that noise is not generated. The above-described operation of the volume control apparatus 1 will be described in detail below using flowcharts.

(Detailed Operation)

Figure 4:
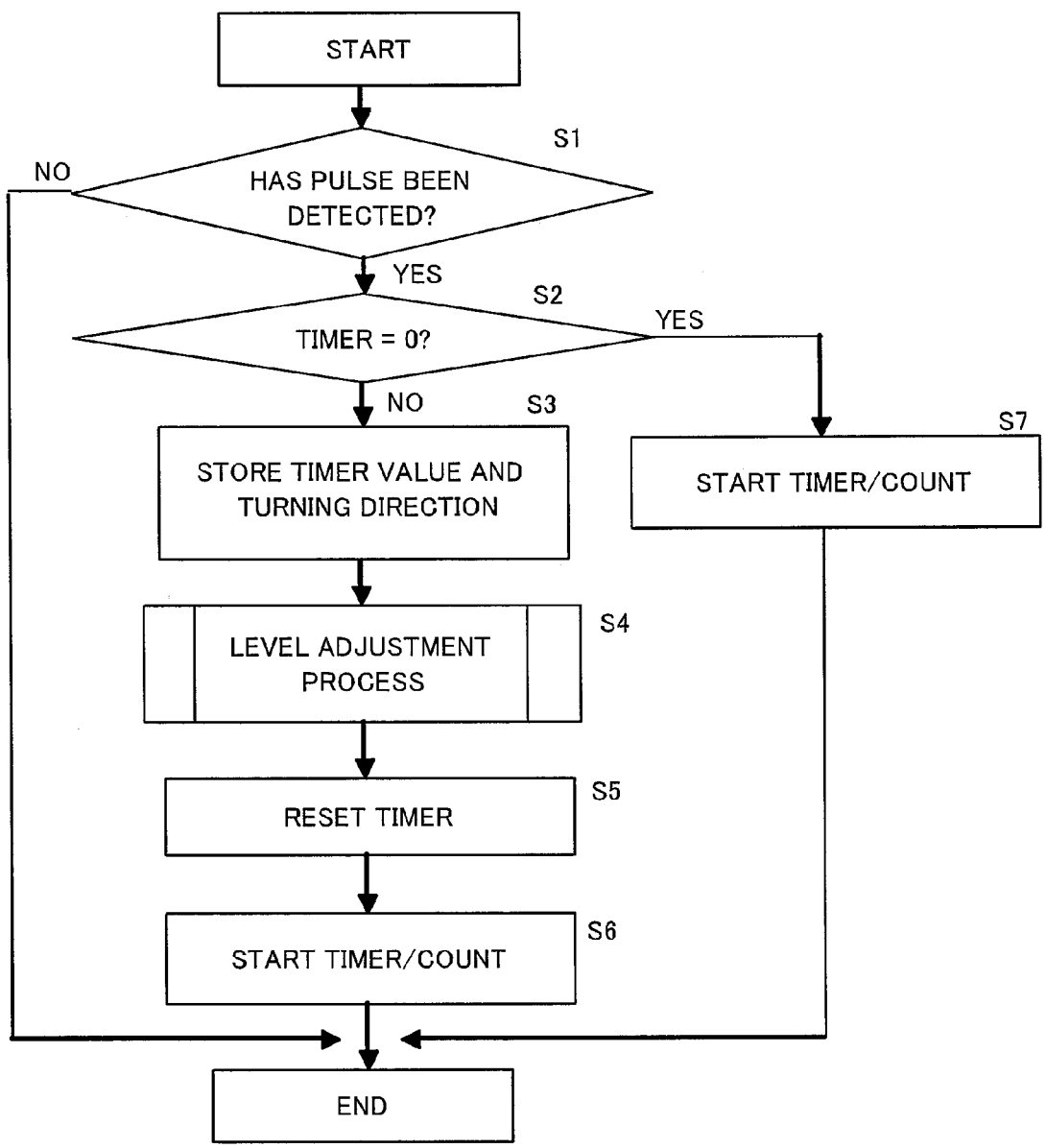
FIG. 4 is a flowchart showing a detailed operation of the volume control apparatus shown in FIG. 1.

The control unit 10 repeatedly performs an operation process shown in FIG. 4 in a sufficiently shorter period of time than the cycle of a pulse train received from the rotary encoder 17.

Referring to FIG. 4, the control unit 10 first determines whether a rise of a pulse from the rotary encoder 17 has been detected (S1). Specifically, the CPU 11 in the control unit 10 checks whether a predetermined one of two types of pulse trains outputted from the rotary encoder 17 is at an H (high) level or L (low) level. Then, the checked level is compared with a level (stored in the memory 12) determined at the last operation. As a result of the comparison, if the pulse train is changed from the L level to the H level, then it is determined that a pulse has been detected (YES in S1). On the other hand, if the check result is the same as the level obtained last time (NO in S1), then the operation process temporarily ends. Note that the level (H or L) of the pulse train stored in the memory 12 is updated with the check result obtained this time.

If a rise of a pulse has been detected in step S1 (YES in S1), then the control unit 10 reads a count value of a timer and determines whether the count value is 0 (S2). The timer measures the time from a rise of the first pulse from the rotary encoder 17 to a rise of the next pulse, i.e., one cycle of a pulse train, and is configured by a counter that counts the number of clock pulses with a predetermined frequency.

If, as a result of the determination in step S2, the count value of the timer is 0 (YES in S2), then since it is the first rise of a pulse train after the user has started an operation (turn) on the turn knob 16, the timer is started (S7) and the operation ends. On the other hand, if the count value of the timer is not 0 (NO in S2), then since it indicates that one cycle of a pulse train outputted from the rotary encoder 17 has been detected, the control unit 10 stores the count value of the timer in the memory 12 (S3) and performs a level adjustment process (S4). Note that in step S3 a turning direction of the turn knob 16 is also stored in the memory 12. A method of determining the turning direction of the turn knob 16 is known and thus description thereof is omitted here.

The control unit 10 determines an instructed amount of change according to the mode (the attenuation mode, the transition mode, or the amplification mode) of the volume control apparatus 1 and by the level adjustment process in step S4, and instructs the electronic volume 15 to adjust the levels of audio signals DS based on the determined instructed amount of change.

After the level adjustment process (S4) is completed, the control unit 10 resets the timer (S5) and restarts the timer (S6) to measure the time of a next pulse train cycle.

As described above, the control unit 10 performs a level adjustment process (S4) each time the control unit 10 detects one cycle of a pulse train outputted from the rotary encoder 17. The level adjustment process will be described in detail below.

Figure 5:
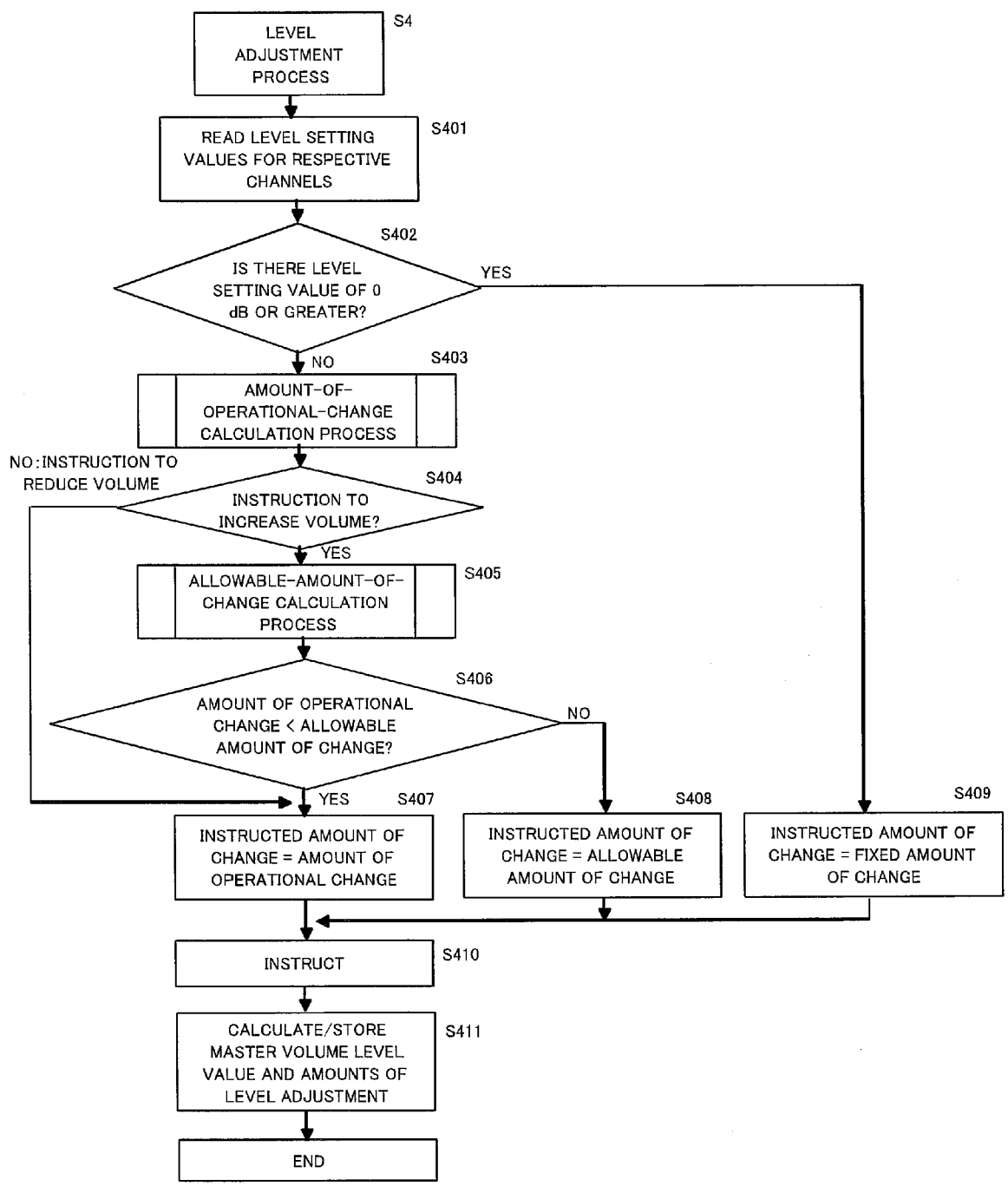
FIG. 5 is a flowchart showing a detail of a level adjustment process in FIG. 4.

Referring to FIG. 5, the control unit 10 first determines whether the electronic volume 15 is in the amplification mode (S401 and S402). Specifically, the control unit 10 refers to the memory 12 to read the amounts of level adjustment for three output channels at the present time (see FIG. 2). Then, it is determined whether, of the three amounts of level adjustment, there is an amount of level adjustment of 0 dB or greater (S402). If there is at least one amount of level adjustment of 0 dB or greater (YES in S402), then the electronic volume 15 is in the amplification mode. Therefore, the control unit 10 determines a predetermined fixed amount of change (e.g., 1 dB) to be the instructed amount of change (S409). Here, the fixed amount of change is, as also described in the foregoing summary of the operation, such a small amount that does not cause noise or an unusual sound when the electronic volume 15 performs an amplification process.

On the other hand, if, as a result of the determination in S402, all of the amounts of level adjustment are less than 0 dB (NO in S402), then the electronic volume 15 is in the attenuation mode or the transition mode. Hence, the control unit 10 calculates an amount of operational change which can be used in either mode (S403: an amount-of-operational-change calculation process).

Figure 6:
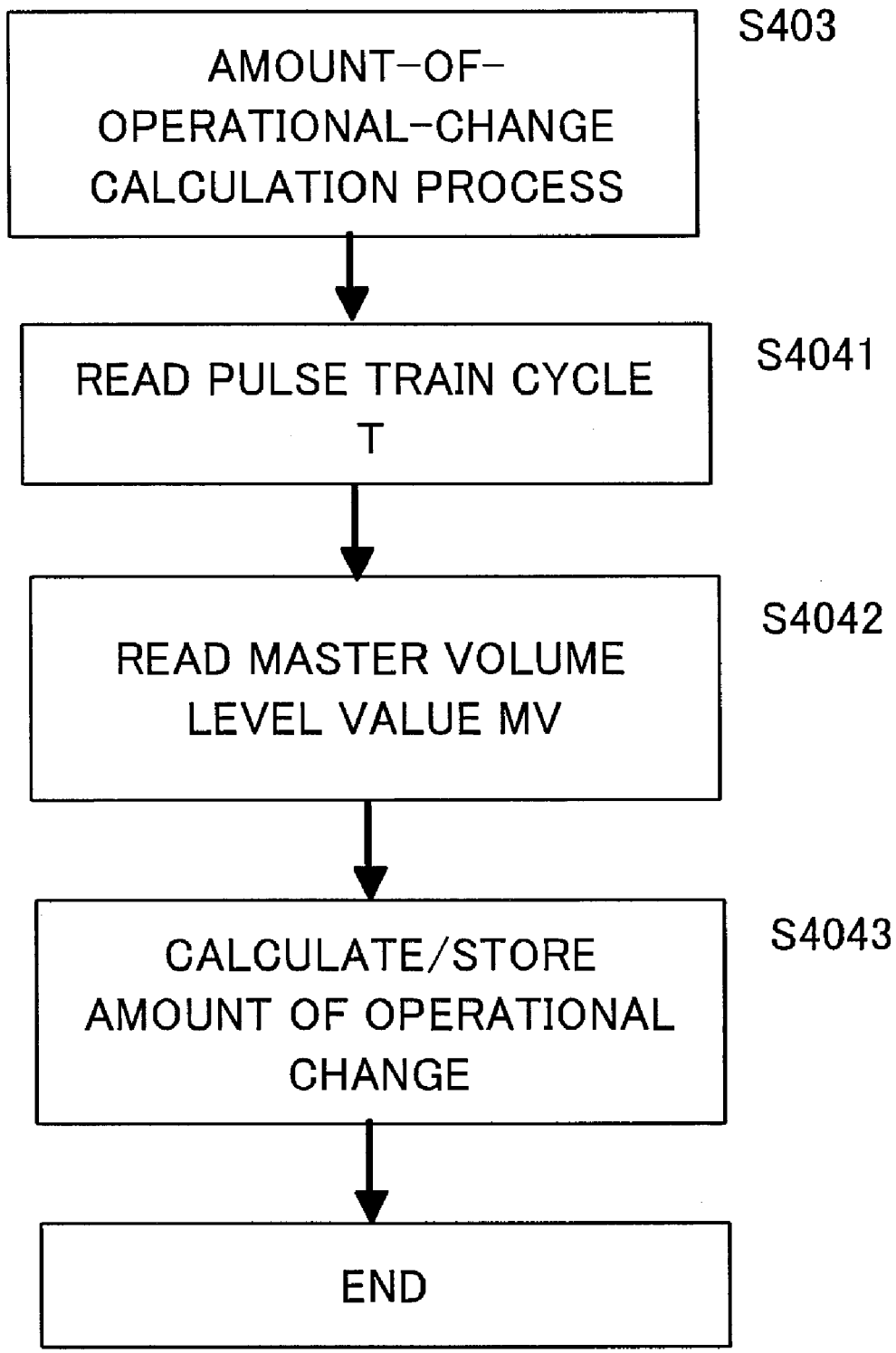
FIG. 6 is a flowchart showing a detail of an amount-of-operational-change calculation process in FIG. 5.

Referring to FIG. 6, in the amount-of-operational-change calculation process, the control unit 10 reads a pulse train cycle T (unit is msec) which is stored in the memory 12 in step S3 (S4041). The control unit 10 further reads a master volume level value MV (unit is dB) which is stored in the memory 12 (S4042). Based on the read pulse train cycle T and master volume level value MV, the control unit 10 calculates an amount of operational change (dB) (S4043). Here, when the pulse train cycle T is the same, the control unit 10 sets the amount of operational change such that the smaller the master volume level value MV the greater the amount of operational change, and the greater the master volume level value MV the smaller the amount of operational change. For example, the control unit 10 calculates the amount of operational change (dB) by the following equation (2) (S4043):

$$\text{Amount of operational change} = A/((T+B) \times (MV+C)) + D \quad (2)$$

where A, B, C, and D are constants greater than 0.

The above-described equation (2) is an example for calculating the amount of operational change. In a word, the amount of operational change is set such that the shorter the pulse train cycle T and the smaller the master volume value MV the greater the amount of operational change, and the longer the pulse train cycle T and the greater the master volume value MV the smaller the amount of operational change. The control unit 10 temporarily stores the calculated amount of operational change in the memory 12.

Returning to FIG. 5, after the amount of operational change is calculated, the control unit 10 determines whether the control unit 10 has received an instruction to increase volume or to reduce volume by the user operation (S404). Specifically, the control unit 10 reads the turning direction of the turn knob 16 stored in step S3. If the turning direction of the turn knob 16 is the reverse direction, then the control unit 10 determines that the control unit 10 has received an instruction to reduce volume by the user operation (NO in S404). In the case of volume reduction and if all of the amounts of level adjustment of the electronic volume 15 at the present time are less than 0 dB (NO in S404), then by the level adjustment process performed this time, the electronic volume 15 always performs an attenuation process. That is, the electronic volume 15 is in the attenuation mode. Therefore, the control unit 10 determines the calculated amount of operational change to be the instructed amount of change (S407).

On the other hand, if the turning direction read from the memory 12 in step S404 is the forward direction, then the control unit 10 determines that the control unit 10 has received an instruction to increase volume by the user operation (YES in S404) In this case, the electronic volume 15 is in either the attenuation mode or the transition mode. Hence, the control unit 10 calculates an allowable amount of change (S405: an allowable-amount-of-change calculation process).

Figure 7:
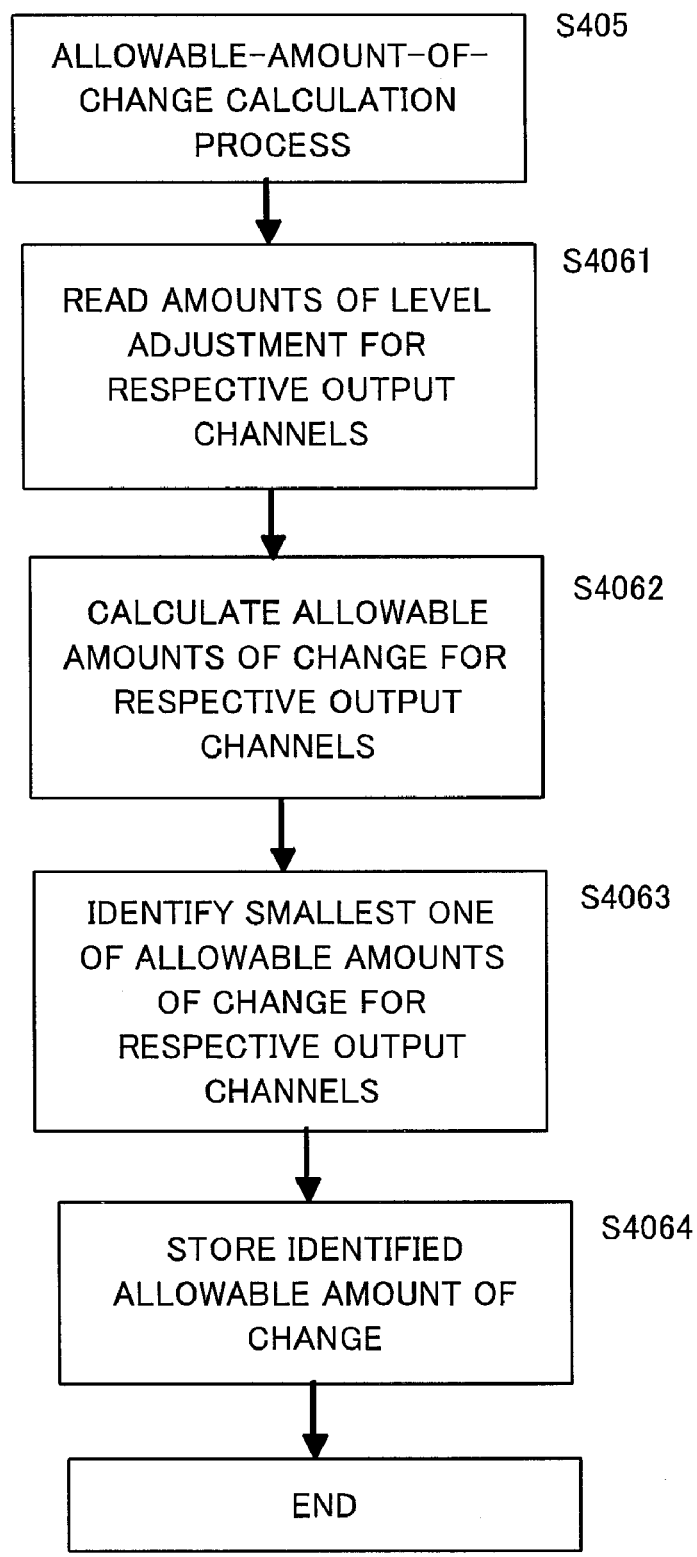
FIG. 7 is a flowchart showing a detail of an allowable-amount-of-change calculation process in FIG. 5.

Referring to FIG. 7, in the allowable-amount-of-change calculation process, the control unit 10 reads the amounts of level adjustment for the respective output channels stored in the memory 12 (S4601). Then, the control unit 10 calculates allowable amounts of change for the respective output channels based on equation (1) (S4062). In the example of FIG. 2, the allowable amount of change for an output channel ChL for the front left speaker is 3 dB. The allowable amount of change for an output channel ChC for the front speaker is 7 dB and the allowable amount of change for an output channel ChR for the front right speaker is 2 dB.

The control unit 10 identifies the smallest one of the calculated allowable amounts of change for the respective output channels (S4063). In the above-described example, the identified allowable amount of change is 2 dB. The identified allowable amount of change is defined as the allowable amount of change of the electronic volume 15 at the present time and stored in the memory 12 (S4064).

Returning to FIG. 5, the control unit 10 reads the amount of operational change and the allowable amount of change which are stored in the memory 12 and compares the two (S406). If the amount of operational change is smaller than the allowable amount of change (YES in S406), then the electronic volume 15 is in the attenuation mode (corresponding to case 1 in FIG. 3). Therefore, the control unit 10 determines the amount of operational change to be the instructed amount of change (S407).

On the other hand, if, as a result of the determination in step S406, the allowable amount of change is smaller than the amount of operational change (NO in S406), then the electronic volume 15 is in the transition mode (corresponding to case 2 in FIG. 3). Therefore, the control unit 10 determines the allowable amount of change to be the instructed amount of change (S408).

After the instructed amount of change is determined by the above-described process, the control unit 10 instructs the electronic volume 15 to adjust the audio signals DS based on the determined instructed amount of change (S410). In response to the instruction from the control unit 10, the electronic volume 15 attenuates or amplifies the audio signals DS for the respective output channels by an amount of level adjustment determined based on the instructed amount of change.

After the instruction is given to the electronic volume 15, the control unit 10 overwrites the master volume level value and the amounts of level adjustment for the respective output channels stored in the memory 12 with a master volume level value and amounts of level adjustment obtained after the adjustment made according to the instruction in step S410 (S411). The overwritten master volume level value and amounts of level adjustment are used for a level adjustment for next time.

Note that the electronic volume 15 may attenuate or amplify signals to a level that is obtained by changing the current amounts of level adjustment by the instructed amount of change, or may attenuate or amplify signals to a level that is obtained by changing the current amounts of level adjustment by a value obtained by multiplying the instructed amount of change by a predetermined coefficient. In either case, the electronic volume 15 adjusts the audio signals DS based on the instructed amount of change and outputs the adjusted audio signals DS to the outside as audio signals So.

Although in the present embodiment the controller to be controlled by the user is a so-called turn controller composed of the turn knob 16 and the rotary encoder 17, the controller may be a sliding controller. In this case, the control unit 10 detects the time required for the sliding controller to be moved by a predetermined amount.

Also, although in the above-described operation process a rise of a pulse train outputted from the rotary encoder 17 is detected, a pulse train cycle T may be detected based on fall timing.

The volume control apparatus 1 according to the present embodiment may be mounted on an audio amplifier such as an AV receiver, or may be mounted on a content player such as a CD player or DVD player.

Although the embodiment of the present invention is described above, the above-described embodiment is merely an example for implementing the present invention. Thus, the present invention is not limited to the embodiment and can be implemented by appropriately modifying the embodiment without departing from the spirit and scope of the present invention.

What is claimed is:

1. A volume control apparatus comprising:
signal processing section for performing digital signal processing and a scaling process on an audio signal outputted from a sound source;
level adjusting section for amplifying or attenuating a level of the audio signal outputted from the signal processing section, by an amount of adjustment determined based on an instructed amount of change, and outputting the amplified or attenuated audio signal to an outside;
storage section for storing a level value of the audio signal outputted to the outside and the amount of adjustment for the audio signal adjusted by the level adjusting section;
detecting section for detecting, when a volume controller is controlled by a user, time required for an amount of operation to reach a predetermined value;
first setting section for setting an amount of operational change based on the level value stored in the storage section and the detected time;
second setting section for setting an allowable amount of change by which the level adjusting section can make an adjustment by an attenuation process, based on the amount of adjustment stored in the storage section;
determining section for determining one of the amount of operational change and the allowable amount of change that has a smaller value to be the instructed amount of change; and
instructing section for instructing the level adjusting section to adjust the level of the audio signal based on the determined instructed amount of change.

2. The volume control apparatus according to claim 1, wherein
when the level adjusting section is amplifying the level of the audio signal, the determining section further determines a predetermined amount of change to be the instructed amount of change.

3. The volume control apparatus according to claim 2, wherein
the signal processing section further generates a plurality of channel audio signals based on the audio signal,
the level adjusting section further amplifies or attenuates levels of the respective channel audio signals,
the storage section further stores amounts of adjustment for the respective channel audio signals,
the second setting section determines allowable amounts of change for the respective channel audio signals, and
the determining section determines a smallest one of the amount of operational change and the allowable amounts of change for the respective channel audio signals, to be the instructed amount of change.

4. The volume control apparatus according to claim 3, wherein
when the level adjusting section is amplifying at least one of the plurality of channel audio signals, the determining section further determines a predetermined amount of change to be the instructed amount of change.

5. The volume control apparatus according to claim 1, wherein
the detecting section further determines, based on control performed on the volume controller by the user, whether an instruction to increase volume or to reduce volume has been received,
when the detecting section determines that the instruction to increase volume has been received, the second setting section sets the allowable amount of change, and
when the detecting section determines that the instruction to reduce volume has been received, and the level adjusting section is attenuating the level of the audio signal, the determining section further determines the amount of operational change to be the instructed amount of change.

6. A non-transitory computer-readable medium storing a volume control program that causes a computer in a volume control apparatus including signal processing section for performing digital signal processing and a scaling process on an audio signal outputted from a sound source; and level adjusting section for amplifying or attenuating a level of the audio signal inputted from the signal processing section, by an amount of adjustment determined based on an instructed amount of change, and outputting the amplified or attenuated audio signal to an outside, to perform the steps of:
storing a level value of the audio signal outputted to the outside and the amount of adjustment for the audio signal adjusted by the level adjusting section;
detecting, when a volume controller is controlled by a user, time required for an amount of operation to reach a predetermined value;
first setting an amount of operational change based on the stored level value and the detected time;
second setting an allowable amount of change by which the level adjusting section can make an adjustment by an attenuation process, based on the stored amount of adjustment;
determining one of the amount of operational change and the allowable amount of change that has a smaller value to be the instructed amount of change; and
instructing the level adjusting section to adjust the level of the audio signal based on the determined instructed amount of change.

7. The volume control program according to claim 6, wherein
when the level adjusting section is amplifying the level of the audio signal, the determining step further determines a predetermined amount of change to be the instructed amount of change.

8. The volume control program according to claim 7, wherein
the signal processing section further generates a plurality of channel audio signals based on the audio signal,
the level adjusting section further amplifies or attenuates levels of the respective channel audio signals,
the step of storing further stores amounts of adjustment for the respective channel audio signals, the step of second setting determines allowable amounts of change for the respective channel audio signals, and the step of determining determines a smallest one of the amount of operational change and the allowable amounts of change for the respective channel audio signals, to be the instructed amount of change.

9. The volume control program according to claim 8, wherein when the level adjusting section is amplifying at least one of the plurality of channel audio signals, the step of determining further determines a predetermined amount of change to be the instructed amount of change.

10. The volume control program according to claim 6, wherein the step of detecting further determines, based on control performed on the volume controller by the user, whether an instruction to increase volume or to reduce volume has been received, when the step of detecting determines that the instruction to increase volume has been received, the step of second setting sets the allowable amount of change, and when the step of detecting determines that the instruction to reduce volume has been received, and the level adjusting section is attenuating the level of the audio signal, the step of determining further determines the amount of operational change to be the instructed amount of change.

* * * * *